(12) United States Patent
Yang

(10) Patent No.: US 6,870,493 B2
(45) Date of Patent: Mar. 22, 2005

(54) DIGITAL-TO-ANALOG CONVERTING CIRCUIT WITH TRANSISTORS HAVING A SAME RATIO OF CHANNEL-WIDTH TO CHANNEL-LENGTH

(75) Inventor: Chien-Sheng Yang, Taipei (TW)

(73) Assignee: Au Optronics Corporation, Hsinchu (TW)

(\*) Notice: Subject to any disclaimer, the term of this patent is extended or adjusted under 35 U.S.C. 154(b) by 0 days.

(21) Appl. No.: 10/065,917

(22) Filed: Nov. 29, 2002

(65) Prior Publication Data

US 2003/0231124 A1 Dec. 18, 2003

(30) Foreign Application Priority Data

Jun. 14, 2002 (TW) .......................................... 91112998 A

(51) Int. Cl.[7] .............................................. H03M 1/00
(52) U.S. Cl. ....................................... 341/136; 341/172
(58) Field of Search ................................. 341/118, 144, 341/155, 172, 136; 345/92, 42

(56) References Cited

U.S. PATENT DOCUMENTS

| | | | |
|---|---|---|---|
| 5,028,822 A | \* | 7/1991 | Hughes ....................... 327/581 |
| 5,177,450 A | \* | 1/1993 | Lee et al. .................... 330/253 |
| 5,798,723 A | \* | 8/1998 | Fong ........................... 341/136 |
| 5,952,948 A | \* | 9/1999 | Proebsting ................... 341/144 |
| 2002/0135406 A1 | \* | 9/2002 | Hossain et al. ............. 327/112 |
| 2003/0025120 A1 | \* | 2/2003 | Chang .......................... 257/92 |

\* cited by examiner

*Primary Examiner*—Peguy JeanPierre
(74) *Attorney, Agent, or Firm*—Jiang Chyun IP Office

(57) ABSTRACT

An digital-to-analog converting circuit of a display, used for a current-type data driver. The digital-to-analog converting circuit is characterized in that the ratio of channel-width to channel-length (W/L) for each transistor thereof is identical, such that no deviation occurs to the current of data output.

5 Claims, 5 Drawing Sheets

DIGITAL-TO-ANALOG CONVERTING CIRCUIT WITH TRANSISTORS HAVING A SAME RATIO OF CHANNEL-WIDTH TO CHANNEL-LENGTH

CROSS REFERENCE TO RELATED APPLICATIONS

This application claims the priority benefit of Taiwan application serial no. 91112998, filed on Jun. 14, 2002.

BACKGROUND OF INVENTION

1. Field of the Invention

The invention relates in general to a digital-to-analog converting circuit, and more particular, to a digital-to-analog converting circuit of a display.

2. Related Art of the Invention

The earliest dynamic image that human beings have seen is saw was the documentary movie. Later on, When the invention of the cathode ray tubes successfully induces brought on the production of commercial television, which then becomes thethis became an almost necessary appliance for almost every household. The cathode ray tubes are then were further applied as to the desktop monitor and dominated computer industry for decades. However, cathode ray tubes have problems with the radiation problem and the massive space occupied by the internal electron gun, and the displays using the cathode ray tubes cannot be made thinner and lighter.

The above problems triggered the researchers to commence the research on flat panel displays. Such fields includes liquid crystal display (LCD), field emission display (FED), organic light emitting diode (OLED), and plasma display panel (PDP).

The organic light emitting diode, also referred to organic electro-luminescence display (OELD), is a self-illuminant device. The characteristics of organic electro-luminescence displays include low DC driving voltage, high brightness, high efficiency, high contrast, thin, and high degree of freedom for three primary colors, including red (R), green (G) and blue (B) to white. Therefore, the organic electro-luminescence display has becomes the leading technology of flat panel display for the next generation. In addition to the advantages of thin dimension, high resolution, self-illumination, fast response speed and power-saving cold light source, the organic electro-luminescence display is further characterized in wide viewing angle, promising color contrast, and low fabrication cost. Therefore, the organic light emitting diode has been broadly applied as the backlight source of liquid crystal display or indicating panel, cellular phones, digital camera, and personal data assistant.

In terms of driving method, the organic light emitting diode can be classified into the passive matrix driving type and the active matrix driving type. The passive matrix driving type of organic light emitting display is advantageous in that its simply simple structure that does not require the application of thin-film transistor (TFT). Therefore, the fabrication cost of the passive matrix driving type of organic light emitting diode is relatively low. But such type of organic light emitting diode is not suitable for use in high-resolution applications. In the development of a large panel diode, the problems of increasing power consumption, reduced device lifetime, and poor display quality may occur. In contrast, the active matrix type of organic light emitting diode meets the requirement of a large display panel while retaining the characteristics of wide viewing angle, high brightness, and fast response time. However, such a type of organic light emitting diode is relatively more expensive.

In the driving source viewpoint, the flat panel display can be divided into voltage driving type and current driving type. The voltage driving type is typically applied to thin-film transistor liquid crystal display (TFT LCD). By inputting different voltages to data lines, different gray scales are resulted to achieve full color display. The current driving type is normally applied to the organic light emitting diode display. That is, by inputting different current to data lines, different gray scales can be obtained to achieve the full color display.

For the current driving type organic light emitting diode, the data current is provided from the digital-to-analog converting circuit of the data driver to drive the pixels of the display illuminating display. The circuit diagram of the conventional digital-to-analog converting circuit is shown in FIG. 1. As shown in FIG. 1, the digital-to-analog converting circuit uses thin-film transistors $T_{DM}$ 102, $T_{D1}$ 104, $T_{D2}$ 106, $T_{D3}$ 108 and $T_{D4}$ 110, of which the channels lengths (L) are the same, while the channel widths (W) are different. That is, the dimensions of the thin-film transistors used in the digital-to-analog converting circuit are different from each other. Due to process inconsistency, the threshold voltages for the thin-film transistors with different dimensions are become inconsistent should process deviation occur. As a result, the output data current is deviated, to affecting the brightness of the organic light emitting diode.

SUMMARY OF INVENTION

The present invention provides a digital-to-analog converting circuit of a display. In the digital-to-analog converting circuit, the ratio of channel-width to channel-length for each transistor is the same, such that the deviation of output data current is avoided.

The digital-to-analog converting circuit provided by the present invention is suitable for use in a current-type data driver. The digital-to-analog converting circuit is characterized in that the ratio of channel-width to channel-length for each transistor is identical.

In one embodiment of the present invention, the digital-to-analog converting circuit further comprises a control device. The control device is coupled to the transistors to receive a plurality of data bits and control the conducting amounts of the transistors based on the data bits.

In one embodiment of the present invention, the digital-to-analog converting circuit is used to generate data current for driving the pixels of the display.

The present invention further provides a digital-to-analog converting circuit of a display used in a current-type data driver. The digital-to-analog converting circuit includes a plurality of transistors and a control device. The control device is coupled to the transistors to receive a plurality of data bits. According to the data bits, the control device controls the conducting numbers among the transistors. The ratio of channel-width to channel-length for each of the transistors is the same.

Accordingly, the deviation of output data current is eliminated since the ratio of channel-width to channel-length for each transistor is identical.

BRIEF DESCRIPTION OF DRAWINGS

These, as well as other features of the present invention, will become more apparent upon reference to the drawings wherein:

FIG. 2b shows the internal structure of the data driver 202 as shown in FIG. 2a;

DETAILED DESCRIPTION

Figure 1:
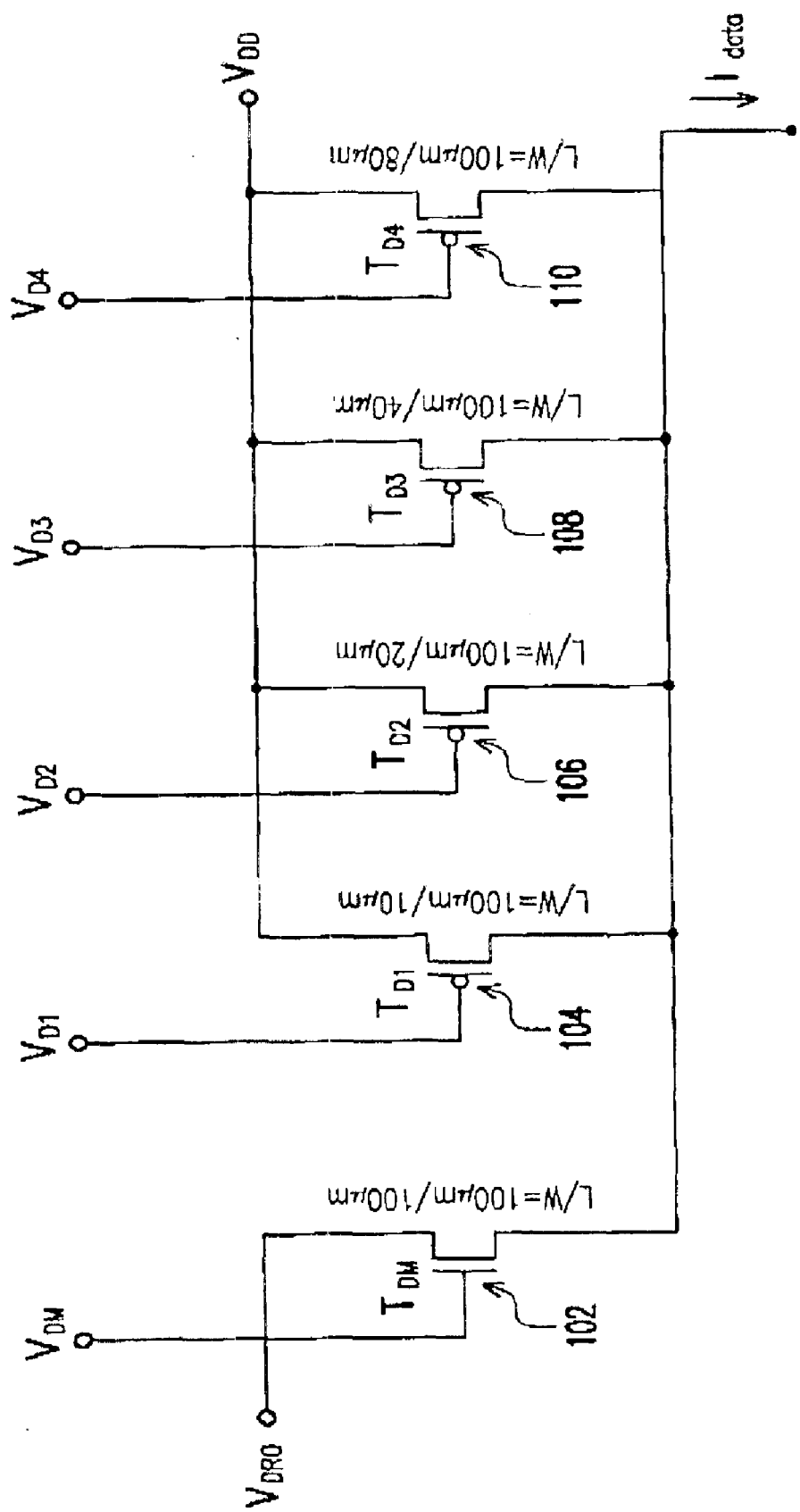
FIG. 1 shows a circuit diagram of the conventional digital-to-analog converting circuit of a display.
Figure 2A:
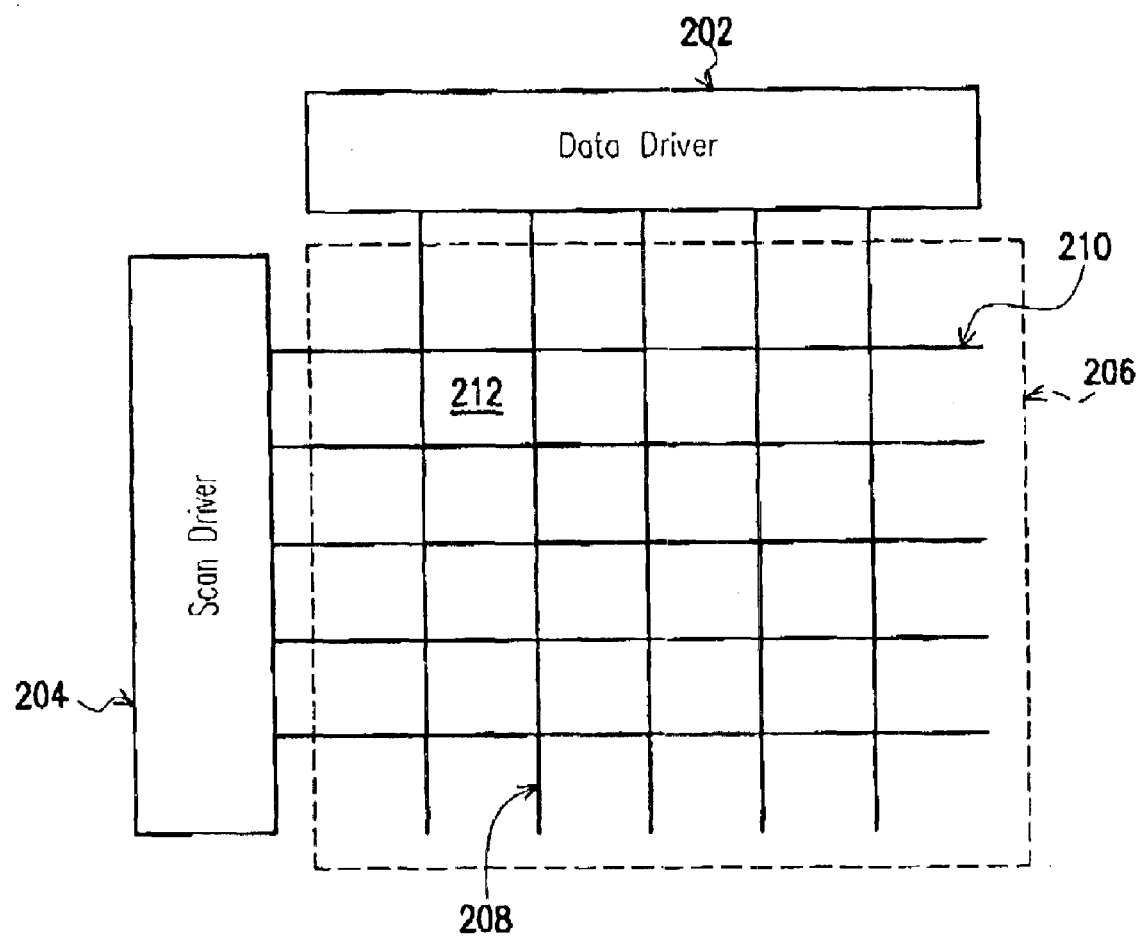
FIG. 2a shows the circuit diagram of a driving circuit of a display according to the present invention.

Referring to FIG. 2a, a circuit diagram of a driving circuit of a display provided by the present invention is illustrated. The driving circuit is an array structure, for example. The driving circuit comprises a data driver 202, a scan driver 204, and an array of transistors 206. The array 206 comprises a plurality of data lines 208 and a plurality of scan lines 210. In the driving circuit, one of the data lines 208 and one of the scan lines 210 construct a pixel 212. the The data driver 202 provides data current to the data lines 208, while the scan driver 204 provides voltage to the scan lines 210.

Figure 2B:
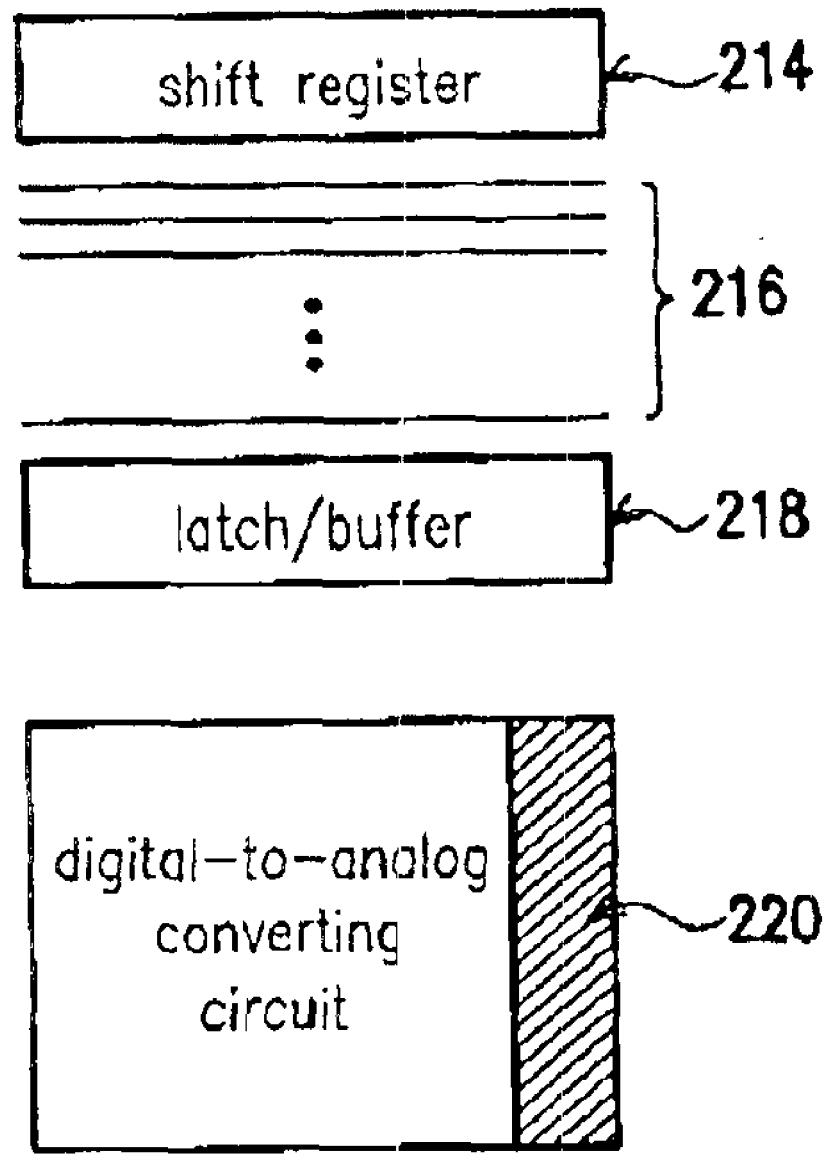

The internal structure of the data driver 202 is shown in FIG. 2b. Referring to FIG. 2b, the data driver 202 comprises a shift register 214, a plurality of bit lines 216, a latch/buffer 218 and a digital-to-analog converting circuit 220. The digital-to-analog converting circuit 220 outputs an analog data current in response to a digital input signal, such that the pixel of the display, and the organic light emitting diode illuminates.

Figure 3:
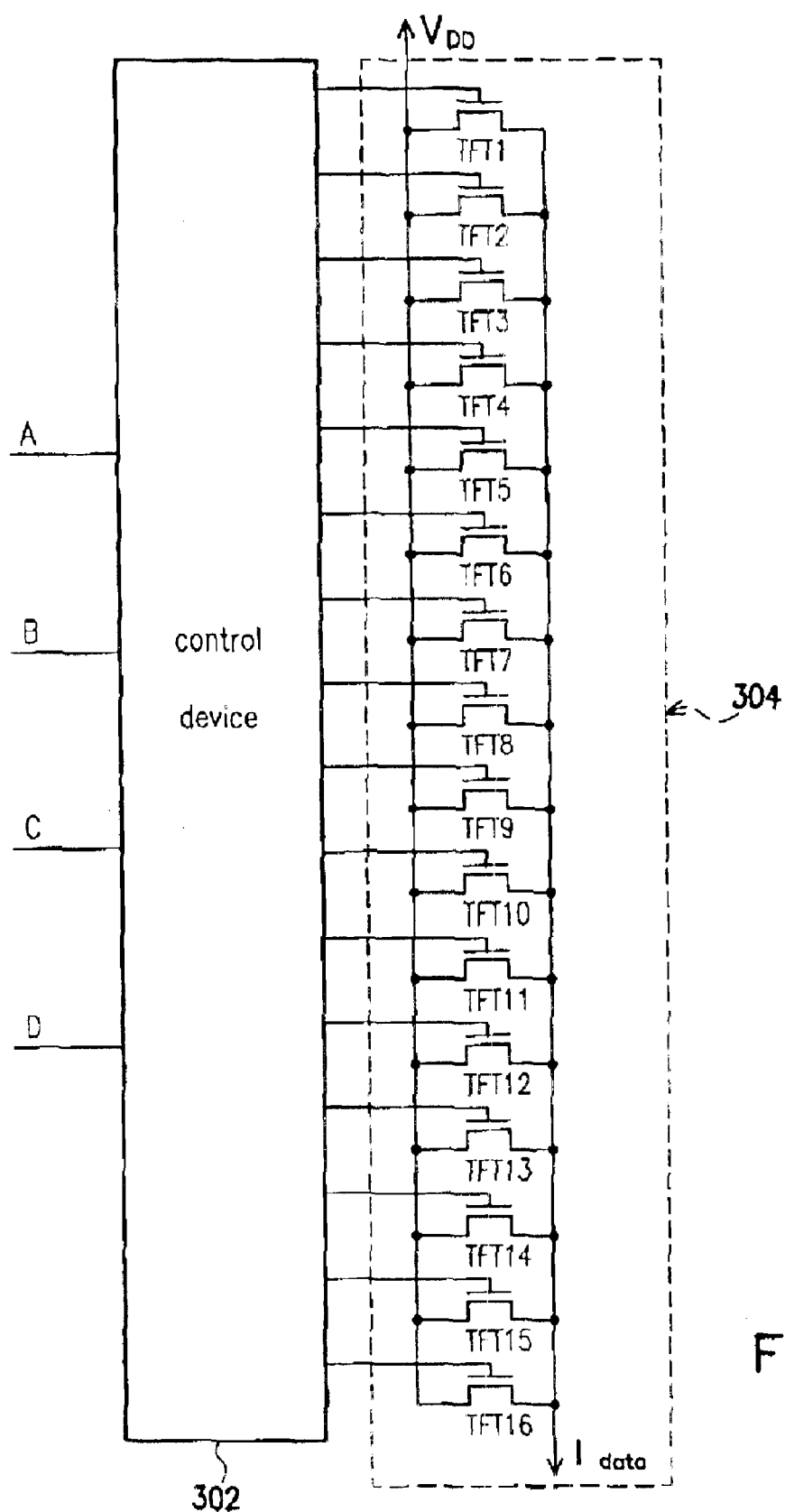
FIG. 3 shows the structure of the digital-to-analog converting circuit in one embodiment of the present invention.

An embodiment of the digital-to-analog converting circuit of the present invention is shown in FIG. 3. The digital-to-analog converting circuit comprises a control device 302 and a plurality of thin-film transistors 304. The control device 302 is coupled to the thin-film transistors 304 to receive a plurality of data bits, and to control the conducting number among the thin-film transistors 304 according to the data bits. The dimension of each thin-film transistor 304 is the same; that is, the ratio of channel width and to channel length for each of the thin-film transistors 304 are is identical.

When n (n is a positive integer) data bits are input to the control device, $2^n$ thin-film transistors with the same dimension are required. In this embodiment, for the convenience of description, 4 data bits are used as an example (that is, 16 thin-film transistors are required). It is appreciated that people of ordinary skill in the art may derive the operation method with a different number of data bits according to the disclosure provided by the embodiment without exceeding the spirit and scope of the present invention. Further, as shown in FIG. 3, the 4 data bits are denoted by A, B, C and D. Being digital signals, the data bits are logic 1 under high voltage level, and logic 0 under low voltage level. As shown in FIG. 3, the 16 thin-film transistors are denoted from TFT1 to TFT16, and the drain of each of which is coupled to a positive voltage $V_{DD}$.

Hereinafter, the operation of the digital-to-analog converting circuit for 4 data bits is described. Referring to Table 1, the logic values for the data bits A, B, C and D and the true value of the conducting number of the thin film transistors TFT1 to TFT16 are provided.

TABLE 1

| D | C | B | A | Number of Conducted Transistor |
|---|---|---|---|---|
| 0 | 0 | 0 | 0 | 1 |
| 0 | 0 | 0 | 1 | 2 |
| 0 | 0 | 1 | 0 | 3 |
| 0 | 0 | 1 | 1 | 4 |

TABLE 1-continued

| D | C | B | A | Number of Conducted Transistor |
|---|---|---|---|---|
| 0 | 1 | 0 | 0 | 5 |
| 0 | 1 | 0 | 1 | 6 |
| 0 | 1 | 1 | 0 | 7 |
| 0 | 1 | 1 | 1 | 8 |
| 1 | 0 | 0 | 0 | 9 |
| 1 | 0 | 0 | 1 | 10 |
| 1 | 0 | 1 | 0 | 11 |
| 1 | 0 | 1 | 1 | 12 |
| 1 | 1 | 0 | 0 | 13 |
| 1 | 1 | 0 | 1 | 14 |
| 1 | 1 | 1 | 0 | 15 |
| 1 | 1 | 1 | 1 | 16 |

As shown in Table 1, when the data bits A, B, C, D are all logic 0, only the transistor TFT1 is conducted to generate the data current $I_{data}$. When the logic vales of the data bits A, B, C, D, are 1, 0, 0, 0, the transistors TFT1 and TFT2 are conducted, while the data current $I_{data}$ is only higher than that for only one conducted transistor. When the logic values of the data bits A, B, C, D are 0, 1, 0, 0, the transistors TFT1, TFT2, TFT3 are conducted, while the data current $I_{data}$ is higher than that with two transistors conducted. Similarly, when the logic values of the data bits A, B, C, D are 1, 1, 1, 1, TFT1 to TFT16 are all conducted and a maximum data current $I_{data}$ is obtained. As the dimensions for all the transistors TFT1 to TFT16 are the same, the same threshold voltages can be obtained without being affected by the process deviation. Therefore, the deviation of data current does not occur.

Figure 4:
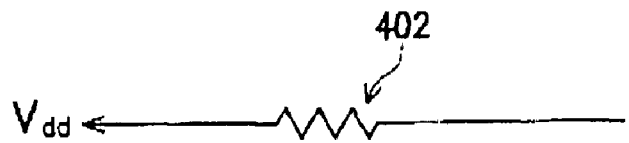
FIG. 4 shows the circuit structure coupled to TFT1 in the control device 302 as shown in FIG. 3.
Figure 5:
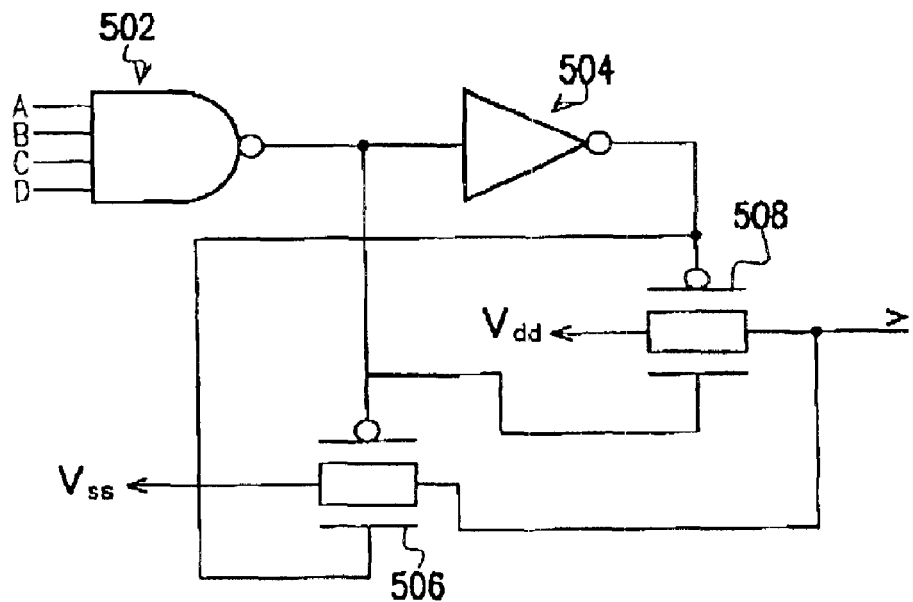
FIG. 5 shows the circuit structure coupled to TFT2 in the control device 302 as shown in FIG. 3.
Figure 6:
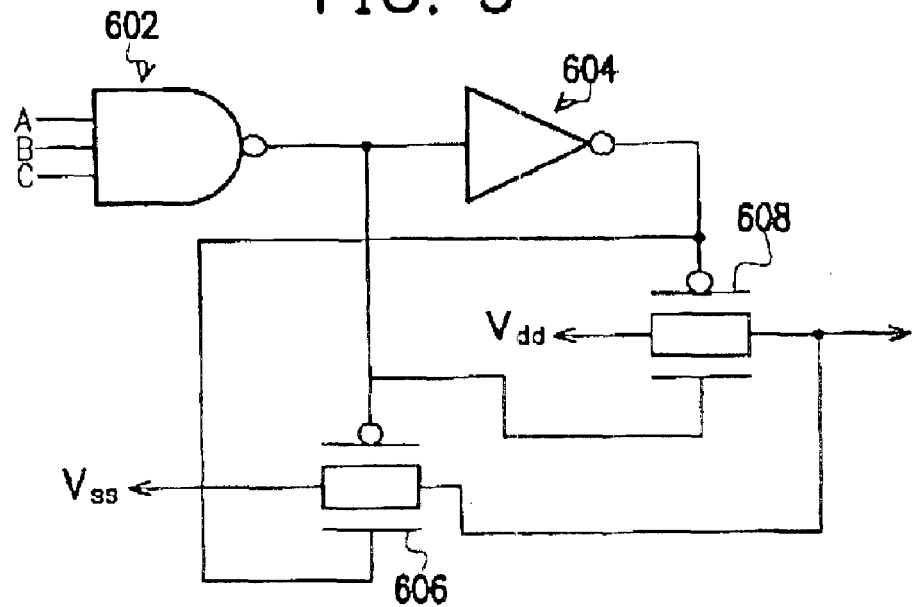
FIG. 6 shows the circuit structure coupled to TFT3 in the control device 302 as shown in FIG. 3.

A few sets of true values in Table 1 are further explained as follows. In the control device 302, the circuit structure coupled to the transistor TFT1 is shown in FIG. 4. The circuit includes a resistor 402, of which one terminal is coupled to the positive voltage $V_{dd}$, while the other terminal is coupled to the gate of the transistor TFT1. In the control device 302, the circuit structure coupled to the transistor TFT2 is shown in FIG. 5. The circuit structure comprises an NAND gate 502, an inverter 504, a pass gate 506, and a pass gate 508. The NAND gate 502 has an input terminal coupled to the data bits A, B, C, D. The circuit structure of the control device 302 coupled to the transistor TFT3 is illustrated to in FIG. 6. the The circuit structure comprises an NAND gate 602, an inverter 604, a pass gate 606 and a pass gate 608. The input terminal of the NAND gate 602 is coupled to the data bits A, B, C, D. Each of the pass gates includes an NMOS transistor and a PMOS transistor.

In the example that all the data bits A, B, C and D are logic 0, only the resistor 402 provides the voltage to the gate of the transistor TFT1. Therefore, the transistor TFT1 is the only conducted transistor.

When the data bits A, B, C, D are logic 1, 0, 0, 0, the output terminal of the NAND gate 502 is logic 1. The output terminal of the inverter 504 is logic 0. The pass gate 506 is switched off, while the pass gate 508 is conducted. The positive voltage is provided to the gate of the transistor TFT2, which is thus conducted. Meanwhile, the transistor TFT1 is also conducted to result in two conducted transistors under such circumstance.

When the data bits are logic 0, 1, 0, 0, the output terminal of the NANG NAND gate 602 is logic 1. The logic value of the output terminal of the inverter 604 is 0. Meanwhile, the pass gate 606 is switched off, while the pass gate 608 is switched on. The voltage $V_{dd}$ is provided to the gate of the transistor TFT3, which is thus conducted. Meanwhile, the transistors TFT1 and TFT2 are also conducted, so that there are three conducted transistors under such conditions.

The operation for the data bits with other logic values can be derived based on the same principal.

According to the above, in the present invention, the channel length and width for each transistor in the digital-to-analog converting circuit are the same, such that the data current deviation is eliminated.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A digital-to-analog converting circuit applied to a current-type data driver of a display, and operative to generate a data current to drive a plurality of pixels of the display, characterized in comprising a plurality of transistors, wherein the ratio of channel-width to channel-length of each transistor is identical.

2. The digital-to-analog converting circuit according to claim 1, further comprising a control device coupled to the transistors to receive a plurality of data bits, so as to control a conducting number among the transistors according to the data bits.

3. A digital-to-analog converting circuit, applied to a current-type data driver, and operative to generate a data current to drive a plurality of pixels of a display, comprising:
   a plurality of transistors; and
   a control device coupled to the transistors, the control device being operative to receive a plurality of data bits and to control the number of the conducted transistors among the transistors based on the data bits;
   wherein the ratio of the channel-width to channel-length for each of the transistors is the same.

4. A digital-to-analog converting circuit, suitable for use in a current-type data driver of a display, the digital-to-analog converting circuit characterized in comprising a plurality of transistors, the ratio of channel-width to channel-length of each of the transistors being the same, wherein a source/drain terminal of each of the transistors is coupled to an operation voltage, the digital-to-analog converting circuit being operative to receive a plurality of data bits and to control the number of the conducted transistors among the transistors based on the data bits to genterate an current in accordance with the data bits.

5. A digital-to-analog converting circuit, suitable for use in a current-type data driver of a display, the digital-to-analog converting circuit comprising:
   a control device; and
   a plurality of transistors, the ratio of channel-width to channel-length of each of the transistors being the same, wherein a source/drain terminal of each of the transistors is coupled to the control device and a gate terminal of each of the transistors is coupled to an operation voltage, the control device being operative to receive a plurality of data bits and to control the number of the conducted transistors among the transistors based on the data bits to generate a current in accordance with the data bits.

* * * * *